United States Patent [19]

Yoder et al.

[11] Patent Number: 4,977,101

[45] Date of Patent: Dec. 11, 1990

[54] MONOLITHIC PRESSURE SENSITIVE INTEGRATED CIRCUIT

[75] Inventors: Douglas J. Yoder, Sharpsville; Ronald E. Brown, Kokomo; Paul E. Stevenson, Kokomo; Donald L. Hornback, Kokomo; Ronald K. Leisure, Kokomo, all of Ind.

[73] Assignee: Delco Electronics Corporation, Kokomo, Ind.

[21] Appl. No.: 396,250

[22] Filed: Aug. 21, 1989

Related U.S. Application Data

[62] Division of Ser. No. 189,446, May 2, 1988, Pat. No. 4,885,621.

[51] Int. Cl.$^5$ .................... H01L 21/70; H01L 21/265
[52] U.S. Cl. ......................... 437/51; 437/31; 437/32; 437/901; 73/727
[58] Field of Search ............ 437/32, 51, 901; 73/727

[56] References Cited

U.S. PATENT DOCUMENTS

| | | | |
|---|---|---|---|
| 3,858,150 | 12/1974 | Gurtler et al. | 338/2 |
| 3,893,228 | 7/1975 | George et al. | |
| 3,994,009 | 11/1976 | Hartlaub | 357/26 |
| 4,003,127 | 1/1977 | Jaffe et al. | 29/580 |
| 4,033,787 | 7/1977 | Marshall | 148/1.5 |
| 4,332,000 | 5/1982 | Petersen | 357/26 X |
| 4,372,803 | 2/1983 | Gigante | 156/626 |
| 4,456,901 | 6/1984 | Kurtz et al. | 338/4 |
| 4,618,397 | 10/1986 | Shimizu et al. | 156/628 |
| 4,672,411 | 6/1987 | Shimizu et al. | 357/26 |

FOREIGN PATENT DOCUMENTS 62-266876  11/1987  Japan.
2136204A  9/1984  United Kingdom ............. 357/26

OTHER PUBLICATIONS

A. Bohg, "Ethylene Diamene-Pyrocatechol-Water Mixture Shows Etching Anomaly in Boron-Doped Silicon," *J. Electrochem. Soc.: Electrochemical Technology*, vol. 18, No. 2, pp. 401–402 (Feb. 1971).

J. C. Grenwood, "Ethylene Diamene-Catechol-Water Mixture Shows Preferential Etching of p-n Junction", *J. Electrochem Soc.: Electrochemical Technology*, vol. 116, No. 9, pp. 1325–1326 (Sep. 1969).

J. A. Oakes, "A Pressure Sensor for Automotive Application," *Proceedings of the Third International Conference on Automotive Electronics*, pp. 143–149, 20–23 Oct. 1981, London, England, sponsored by the Institute for Mechanical Engineers.

*Primary Examiner*—Brian E. Hearn
*Assistant Examiner*—Laura M. Holtzman
*Attorney, Agent, or Firm*—Robert J. Wallace

[57] ABSTRACT

A monolithic pressure sensitive silicon integrated circuit is formed by first providing a localized etch-stop layer on one surface of the silicon chip, then growing successive epitaxial layers of opposite conductivity types over this surface. In the upper of the two layers, there is formed a bridge of four piezoresistors overlying the periphery of the etch-stop layer and the conditioning circuitry for amplifying the output of the bridge including both lateral and vertical junction transistors. The back surface of the chip is etched anisotropically to form a cavity that leaves a thin diaphragm underlying the bridge of the four piezoresistors.

4 Claims, 3 Drawing Sheets

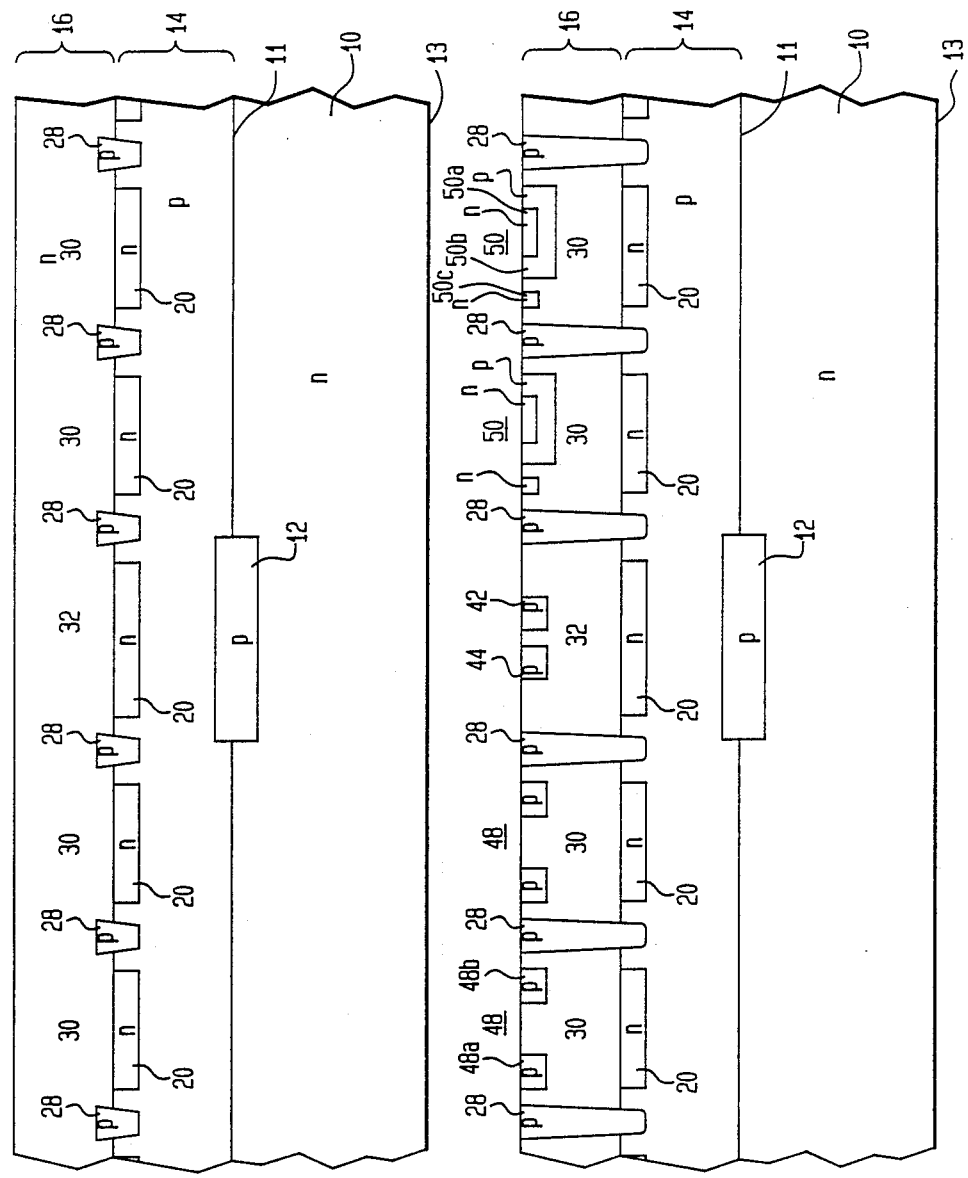

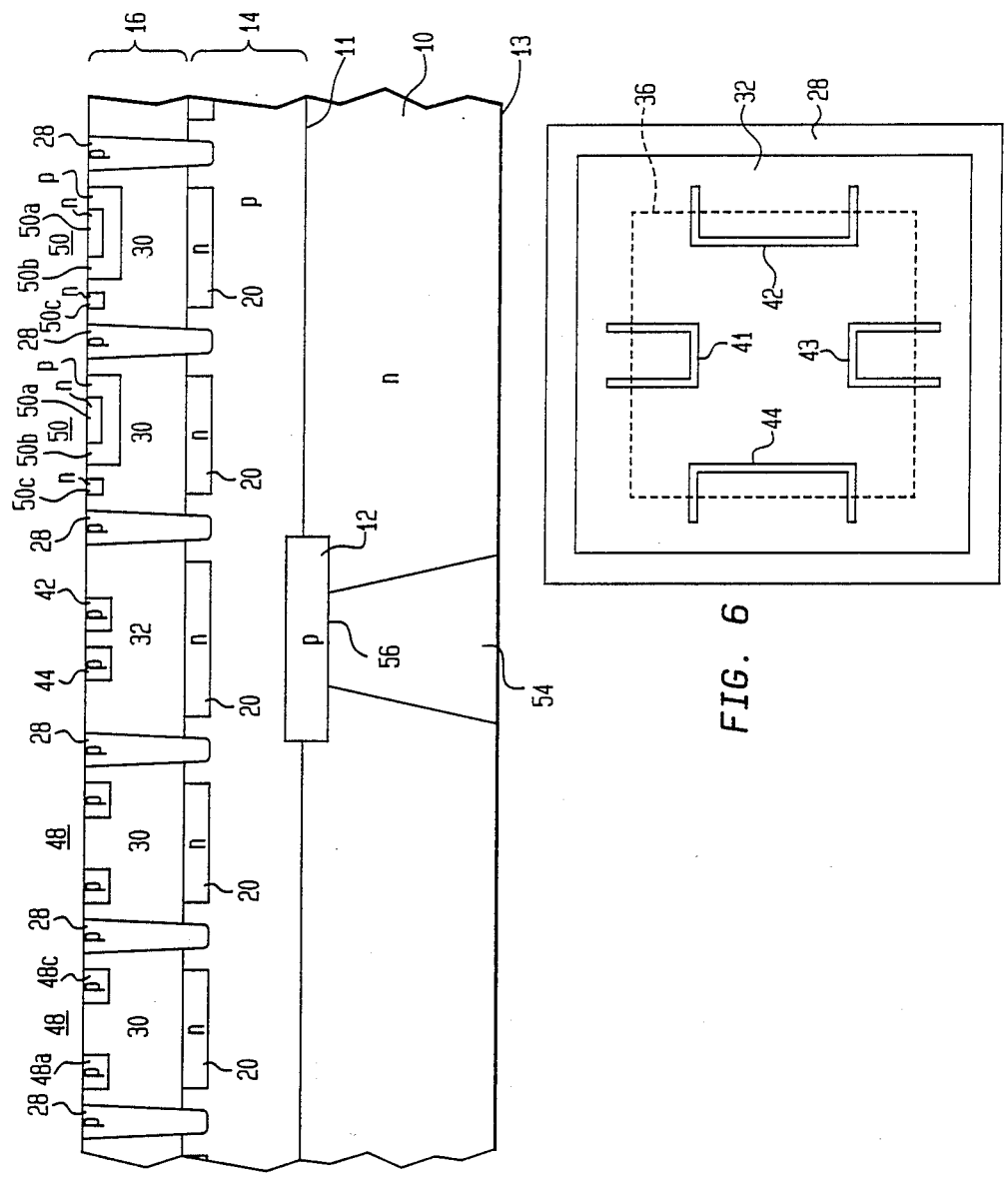

MONOLITHIC PRESSURE SENSITIVE INTEGRATED CIRCUIT

RELATED PATENT APPLICATION

This is a divisional of U.S. Pat. application Ser. No. 07/189,446 filed on May 2, 1988, now 4,885,621.

FIELD OF THE INVENTION

This invention relates to a monolithic pressure sensitive integrated circuit and to a method for its manufacture.

BACKGROUND OF THE INVENTION

A monolithic pressure sensitive integrated circuit is a semiconductor chip in which there are combined a pressure sensitive diaphragm, its piezoresistors, and the circuitry used to process or condition the signal developed by the piezoresistors to make it useful for its designed purpose.

Pressure sensors are of particular use for automotive applications. An article entitled "A Pressure Sensor for Automotive Applications" by J. A. Oakes, *Proceedings of the Third International Conference on Automotive Electronics*, PPS. 143–149, 20–23 October, 1981, London, England, sponsored by the Institute for Mechanical Engineers, describes a pressure sensor for automotive applications that uses two separate chips and a hybrid substrate. One chip includes the sensitive pressure diaphragm and its associated piezoresistors; the second chip includes electronics for amplifying the signal received from the piezoresistors; and the hybrid substrate includes additional conditioning circuits. A monolithic chip to replace such two chips and hybrid substrate has a number of obvious advantages. A process for preparing a monolithic pressure sensor which combines both the pressure sensitive elements and conditioning electronics is described in U.S. Pat. No. 4,618,397 that issued on Oct. 21, 1986.

However, the present invention in one aspect is a process for making a monolithic pressure sensor by a different process believed to be more reliable, manufacturable and to yield an improved sensor.

SUMMARY OF THE INVENTION

In particular, in the process of the present invention, greater use is made of multifunction steps whereby there can be reduced the total number of steps in the process. For example, the diffusion step used to form base zones of vertical junction transistors and emitter and collector zones of lateral transistors included in the conditioning circuitry is also used to form diffused piezoresistors used for sensing.

In the manufacture of a pressure sensitive integrated circuit in accordance with an example of the invention, there is first prepared as the starting material a monocrystalline semiconductive wafer that is lightly doped n-type. The wafer is cut so that both its major top and bottom surfaces lie along <100> crystal planes and are appropriately separated to provide a thickness to the wafer sufficient to facilitate handling of the wafer. Typically, the wafer is large enough in lateral area to accommodate many sensors and ultimately the wafer will be diced to form many chips each including one or more sensors. The description will focus on the preparation of an individual sensor for reasons of simplicity.

There is then formed in the top surface of the wafer for each sensor a heavily doped p-type etch-stop layer that will be used to control the degree of localized thinning of the wafer to form the diaphragm of each sensor. Then a first p-type epitaxial silicon layer is grown over the top surface of the wafer, advantageously in two stages, the first with little intentional doping and the second with added p-type doping. This first epitaxial layer serves to isolate the heavily-doped etch-stop layer from a subsequently grown n-type second epitaxial layer in which the integrated circuit is to be formed. At the top of the first epitaxial layer, selected regions are treated to be heavily n-type for use as buried layers in the circuitry to be formed and other selected regions are treated to be more heavily p-type for use in forming pairs of vertical p-n junctions which are used for isolating the various elements of the circuitry to be formed. Typically, the circuitry includes at least a hundred transistors. In an illustrative embodiment these transistors include both lateral p-n-p junction transistors and vertical n-p-n junction transistors.

Thereafter a second epitaxial layer of n-type conductivity, opposite that of the first epitaxial layer, is grown thereover. This second epitaxial layer is then treated to include four piezoresistors appropriately positioned over the periphery of the etch-stop layer, both vertical and lateral junction transistors in the surrounding regions, diffused resistors, and pairs of vertical p-n junctions for isolating, where necessary, the elements (components) of the circuitry in the second epitaxial layer. As previously mentioned, in the preferred embodiment, the piezoresistors, the diffused resistors, the pairs of isolation junctions, the base zones of the vertical junction transistors, and the emitter and collector zones of the lateral junction transistors are formed by a common masked p-type diffusion step. A common n-type diffusion step is then used to form the emitter zones of the vertical junction transistors and the base contact areas of the lateral transistors. The circuit elements are then interconnected on the top surface by appropriate metallization. Finally, the back surface of the original substrate is appropriately etched to form a cavity that extends to the etch-stop layer, leaving the chip thinned there to form a diaphragm across which there is developed in operation the pressure differential being sensed. This pressure differential strains the four piezoresistors, positioned opposite the periphery of the diaphragm and typically connected in a Wheatstone bridge, and the change in their resistances gives rise to a voltage that is amplified by the conditioning circuitry on the chip. Additionally, the conditioning circuitry typically is adapted to provide compensation for the temperature coefficient of the piezoresistors so that temperature effects are minimized.

The invention will be better understood from the following more detailed description taken in conjunction with the accompanying drawings. dr

BRIEF DESCRIPTION OF THE DRAWINGS

FIGS. 1 through 5 show cross-sectional views of a silicon wafer at various stages in its processing into a pressure sensitive integrated circuit (IC) in accordance with the invention; and FIG. 6 is a top view of a portion of the wafer to illustrate the disposition of the piezoresistors of the device relative to the diaphragm included to create the pressure sensitive region of the IC.

It is to be noted that the drawings are not to scale since the vertical dimensions generally are much smaller than the horizontal dimensions. To increase clarity the scale used for FIG. 6 is different than used for FIGS. 1–5.

DETAILED DESCRIPTION

Figure 1:
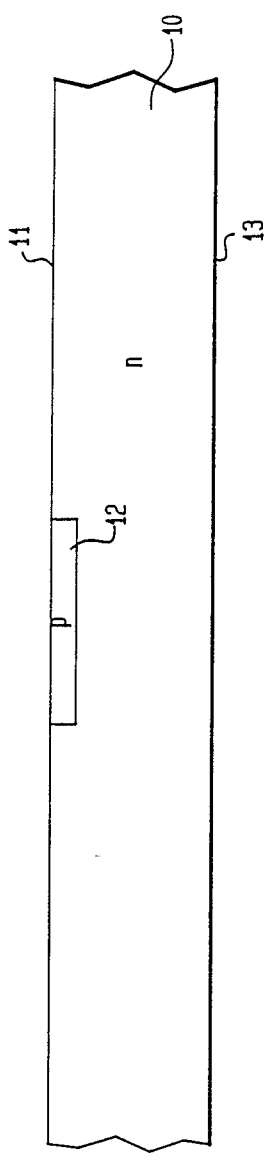

Referring now to FIG. 1, there is shown a cross-sectional view of a portion of a wafer 10 of monocrystalline silicon, illustratively of n-type, whose resistivity is not especially critical but is typically of fairly high resistivity, for example, between one and ten ohm-centimeters, so as to be easily etched. Its thickness should be no greater than that necessary for good mechanical support, since it will eventually need to be thinned and the thicker it is initially the more the thinning that will need to be done. Typically, it's thickness will be several hundred microns, for example, 400 microns. Typically the lateral surface area of the wafer 10 is selected to be sufficiently large to accommodate at least several hundred sensors. The wafer 10 eventually will be diced up to form individual chips including usually only a single sensor. The drawing shows only enough of the wafer 10 to accommodate a single sensor for purposes of simplicity. The wafer 10 advantageously is prepared so that its top and bottom major surfaces 11 and 13, respectively, are oriented parallel to the $<100>$ plane of the silicon crystal so that the subsequent diaphragm thinning can be done in the usual fashion by anisotropic etching of the bottom surface 13 to form uniform well defined cavities with good control of the diaphragm thickness. Typically, the bottom surface 13 is provided with a coating (not shown) to protect it during the processing of the top surface 11.

Moreover, to serve as an etch-stop for the anisotropic etching, there is formed in the top surface 11 of the wafer 10 for each sensor a heavily doped p-type layer (region) 12, localized at the region where the diaphragm of the sensor is to be located. Typically it will be a square of about 70 mils on each side and initially about a micron thick. The p-type doping, which may be done either by ion implantation or diffusion, advantageously is of a concentration of at least $10^{19}$ atoms per cubic centimeter and is typically $6 \times 10^{19}$ atoms per cubic centimeter. Conventional photolithographic techniques can be used to localize layer 12.

Figure 2:
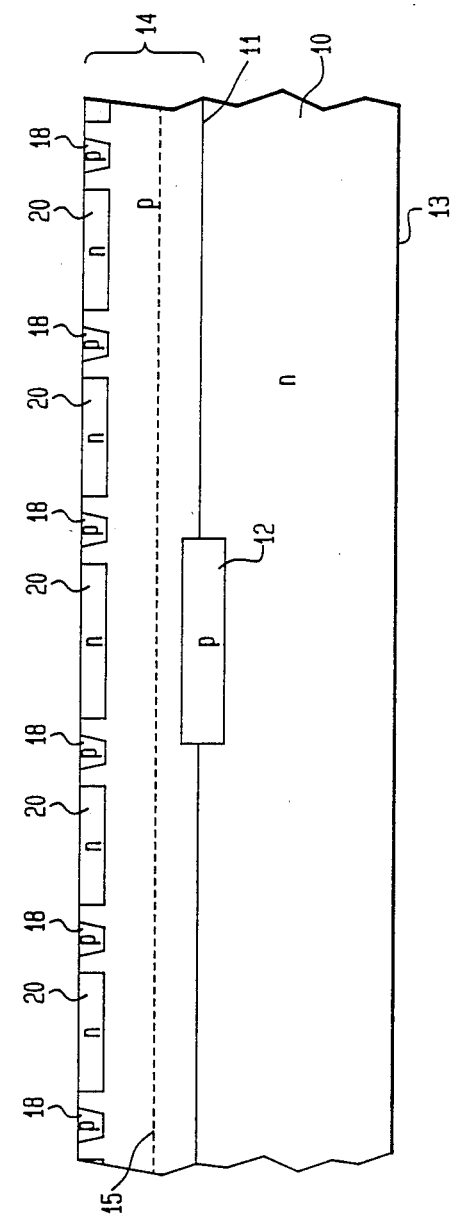

Referring now to FIG. 2, there is shown wafer 10 after further processing with a grown p-type epitaxial layer 14 over the top surface 11 of the wafer 10 which serves as a substrate. Because the first portion of the grown layer 14 tends to be p-type because of autodoping, (the outdiffusion of the p-type dopant in layer 12 into the epitaxial layer), it is feasible to begin the growth of this layer 12 without intentional doping but then to continue the growth in a p-type ambient in the usual fashion to insure that the growth will continue to be p-type. The broken line 15 in FIG. 2 is used to denote that the epitaxial layer 14 was grown with two portions, but this line is not included in subsequent figures to minimize unnecessary complexity in the drawing. This epitaxial layer 14 is typically about fifteen microns thick and largely of a resistivity between 5 and 11 ohms-centimeter although the initially grown material may become more heavily doped because of the autodoping. As mentioned earlier, layer 14 serves primarily as an isolation layer to protect a n-type second epitaxial layer 16 (see FIG. 3) which will be subsequently grown thereover and in which will be formed the elements (circuit components, i.e., piezoresistors, resistors, transistors, capacitors) of the integrated circuit being fabricated.

However, before growing this second epitaxial layer 16 by conventional integrated circuit silicon technology, there are formed at the top surface of the first epitaxial layer 14 various heavily doped p-type loop regions 18 which are typically circular or square in shape. The outdiffusion (updiffusion) from these p-type regions into the n-type second epitaxial layer to be subsequently grown over layer 14 will help form pairs of vertical p-n junctions in such layer to serve as isolation junctions for dividing the layer into separate pockets 30 and 32 (see FIG. 3) in a fashion known in integrated circuit technology. Also formed at the top surface of layer 14 are heavily doped n-type regions 20 that similarly will be useful to form low-resistivity n-type buried layers in this second epitaxial layer 16 to improve the lateral conductance in such layer for various purposes, such as insuring a low collector resistance in a vertical junction transistor formed in such layer.

Referring now to FIG. 3, there is shown wafer 10 after still further processing with a second epitaxial layer 16 whose bulk is lightly doped n-type layer 16 is grown over layer 14, typically to a thickness of about 8.5 microns. During the growth of the layer 16, outdiffusion of acceptors from p-type doped regions 18 will begin the formation of annular-like p-type pockets or wells 28 that eventually enclose circular n-type pockets, all of which are denoted as 30 except for a central pocket 32 opposite etch-stop layer 12, and isolate each such individual pocket 30,32 from the rest of the layer 16 by the pair of vertical p-n junctions formed by the inner and outer walls of the annular p-type regions 28 and n-type pockets 30, 32. This permits a junction transistor to be formed in each such pocket 30. Each of the thus formed junction transistors (which are shown in FIG. 4) is isolated from the others in the manner well known in silicon integrated circuit technology. Piezoresistors (which are shown in FIG. 4) that will serve as the sensing elements of the sensor being fabricated are to be formed in pocket 32.

Referring now to FIG. 4, there is shown wafer 10 after still further processing in which piezoresistors 41, 42, 43 and 44 (only 42 and 44 are shown in this view; FIG. 6 which shows a top view of all four piezoresistors) are formed in pocket 32, lateral transistors 48 are formed in some of pockets 30, and vertical transistors are formed in others of pockets 30. Advantageously four separate piezoresistors are formed in pocket 32, suitable for connection together as the four arms of a Wheatstone bridge. Each of the piezoresistors typically is a diffused p-type region that is provided with the necessary contact areas for its interconnection. A typical layout for the piezoresistors is described in the first-mentioned J. A. Oakes paper. As mentioned earlier, there may be as many as a hundred or more elements in the conditioning circuitry depending on the sensitivity desired and the degree of compensation desired for various temperature and aging effects. Typically, one such transistor is formed in each of the enclosed pockets 30 defined by the annular p-type regions 28 formed by extending the earlier p-type regions 18 through the full thickness of layer 16. Advantageously, although not necessarily, most or all of the transistors are of the bipolar junction type. It is usually desirable to have complementary transistors (both n-p-n and p-n-p types) for circuitry that will operate with low current drain. This is achieved by forming the p-n-p types as lateral transistors 48 and the n-p-n types as vertical transistors 50 since this permits the multiple use of some of the diffusion steps of the processing.

In particular, in the illustrative embodiment of the invention, there are first introduced acceptor atoms, selectively either by a common step of ion implantation or vapor-solid diffusion, to form p-type base zones 50b of the vertical transistors 50, p-type emitter 48a and collector 48c zones of the lateral transistors 48, p-type piezoresistors 41, 42, 43 and 44 (only 42 and 44 are shown in FIG. 4; 41, 42, 43, and 44 are shown in a top view in FIG. 6) in the central region 32, any other resistors (not shown) that may be needed and also the topmost portions of the p-type isolation pockets 28. This can be followed by a common step for the selective introduction of donor atoms to form the n-type emitter 50a zones of the vertical transistors 50, and to form heavily doped n-type surface regions 50c to define the collector contact regions in the vertical transistors 50 and the base contact regions (not shown) in the lateral transistor 48. N-type regions 30 serve as the base regions of each of transistors 48. The introductions of the donor and acceptor atoms are localized to selected regions in the usual fashion, for example, by appropriate masks on the surface that have been patterned by photolithographic techniques familiar in integrated circuit technology. Thereafter, the various elements formed are interconnected into the desired circuit configurations by patterned metal layers (not shown) on the top surface of layer 16 appropriately insulated from one another, as required, by insulating layers (not shown). Finally passivating layers (not shown) are provided over the top surface of layer 16 to insure the desired environmental protection. Such processing will not be described in detail because it is well known in the art.

Referring now to FIG. 5, there is shown wafer 10 after still further processing. The bottom surface 13 of wafer 10 is thinned to form the diaphragm properly positioned with respect to the piezoresistors 41, 42, 43 and 44. This is done in conventional fashion, for example as described in the J. A. Oakes paper. Basically, there is employed anisotropic etching, using an etchant which etches different crystallographic planes at different rates. In particular, the bottom surface 13 is covered with an etch-resistant mask which is patterned to leave a square opening opposite the square etch-top layer 12, and this surface is then exposed to an etchant, such as potassium hydroxide or ethylene diamine, which is known to etch the <100> plane about 100 times faster than it etches the <111> plane. This etching is permitted to continue until the p-type layer 12 is reached. Layer 12 is heavily doped and therefore highly resistant to etching. Accordingly, it serves as an etch-stop. As a result, as is shown in FIG. 5, there is formed a cavity 54 with smooth side walls that are tapered and form the side walls of a frustum of a pyramid of square cross-section whose top surface 56 corresponds essentially to a portion of the bottom surface of the p-type layer 12.

Thereafter any additional layers believed useful, such as environment-protective coatings, may be provided. At this point, the preparation of the wafer 10 is essentially complete and it is then diced in the usual manner into individual chips, each of which incorporates one or more sensors, as the particular design calls for. Before use, the individual chips are usually packaged in a structure that provides a pressure difference on opposite sides of the diaphragm portion of the chip. Usually this involves providing a vacuum on one side and the pressure to be measured on the opposite side. It can also involve providing atmospheric pressure on one side and the pressure to be measured on the opposite side. Additionally, the package typically includes pins or terminals to the enclosed integrated circuit for the application of power supply voltage and the derivation of output signals for utilization.

Referring now to FIG. 6, there is shown an exploded top view of pocket 32 and the surrounding region 28 which are shown in cross-sectional view in FIGS. 4 and 5. The broken line 36 is the outline of the diaphragm (i.e., the exposed portion of a lower surface of region 12 which is denoted as, typically a square, to be formed by thinning layer 10, and the four piezoresistors 41, 42, 43 and 44 are seen to be positioned around the outline. Each is shown provided at each of its ends with a contact region for connection into a Wheatstone bridge. When the resistors are properly located and the diaphragm is stressed, any two adjacent resistors will change their resistance in opposite senses, while any two opposed resistors will change in the same direction. As is known for a Wheatstone bridge, if a voltage difference is maintained between one pair of opposite corners of the bridge, a signal voltage will be developed across the other pair of opposite corners of the bridge. This voltage typically is supplied to the terminals of an operational amplifier for providing an output voltage for use in an appropriate load. For a more detailed discussion of the optimum location of the piezoresistors, particularly in sensors for use in automotive applications, reference is made to the previously mentioned Oakes paper.

It is to be understood that the specific embodiment described is merely illustrative of the general principles of the invention and various modifications can be made therein without departing from the spirit and scope of the invention. It is to be appreciated that other techniques are available for forming the various elements required in the second epitaxial layer 16. Moreover, the various dimensions and doping levels mentioned are merely exemplary and other parameters are feasible and are typically dictated by the intended application. In addition other forms of circuit elements, for example, thin film or MOS transistors, diodes, resistors and capacitors, as needed, can be formed in the top epitaxial layer 16 or on an overlying layer for the conditioning circuitry for use with the piezoresistors. In addition, other configurations of piezoresistors can be formed opposite the diaphragm. Also semiconductors other than silicon can be used so long as they are sufficiently piezoresistive and are amenable to the fabrication of monolithic integrated circuits. Additionally, the particular sequence of steps described in the illustrative embodiment may be modified. In particular, the etching of the cavity to form the diaphragm need not be postponed till near the end of the processing.

The embodiments of the invention in which an exclusive property or privilege is claimed are defined as follows:

1. A process for making a monolithic pressure sensitive integrated circuit comprising:
   forming on one surface of a monocrystalline semiconductor member a localized etch stop region;
   growing in turn over said one surface first and second epitaxial layers of mutually opposite conductivity types;
   said first epitaxial layer having a higher resistivity adjacent said substrate than adjacent said second epitaxial layer;

forming buried layers between said first and second epitaxial layers;

forming in said second epitaxial layer in the region overlying the etch stop a plurality of piezoresistors and in the surrounding region the remainder of the integrated circuit and interconnecting said remainder and the piezoresistors into the desired integrated circuit; and etching anisotropically the back surface of the element in the region underlying the element in the etch stop region to thin the element in the region underlying the piezoresistors.

2. A process for fabricating a monolithic pressure sensitive integrated circuit comprising the steps of:

forming on one surface of a monocrystalline semiconductive member of relatively high resistivity a localized region of conductivity sufficiently high to serve as an etch-stop;

forming over said surface a first epitaxial layer of one conductivity type and relatively high resistivity;

forming in said epitaxial layer a surface region having the conductivity type opposite said one conductivity type and substantially overlying the etch-stop layer and a plurality of surface regions of both the one and the opposite conductivity types in surrounding regions;

forming over said first epitaxial layer a second epitaxial layer of conductivity type opposite said one conductivity type;

forming in said second epitaxial layer by a first doping step localized regions of the one conductivity type for serving as the piezoresistors in regions substantially overlying the periphery of the etch-stop layer, base zones of vertical transistors, emitter and collector zones of lateral transistors an p-n junction isolation barriers;

forming in said second eptiaxial layer by a second doping step, localized regions of the opposite conductivity type for serving as the emitters of the vertical transistors, and doped collector connection regions for vertical transistors;

interconnecting with metallization the piezoresistors and the vertical and lateral transistors in the second epitaxial layer into an integrated circuit; and forming in the back surface of the element a cavity aligned with the etch-stop layer for forming a diaphragm whose periphery underlies the piezoresistors.

3. The process of claim 2 in which the semiconductive material of the member is silicon and the front and back surfaces of the member lie along <100> crystal planes.

4. The process of claim 3 in which the first epitaxial layer is first partially grown without added doping and then grown with added doping.

* * * * *